US007928406B2

(12) United States Patent
Horsky et al.

(10) Patent No.: US 7,928,406 B2
(45) Date of Patent: Apr. 19, 2011

(54) METHOD AND SYSTEM FOR EXTRACTING ION BEAMS COMPOSED OF MOLECULAR IONS (CLUSTER ION BEAM EXTRACTION SYSTEM)

(75) Inventors: Thomas N. Horsky, Boxborough, MA (US); Sami K. Hahto, Nashua, NH (US)

(73) Assignee: SemEquip, Inc., North Billerica, MA (US)

( * ) Notice: Subject to any disclaimer, the term of this patent is extended or adjusted under 35 U.S.C. 154(b) by 336 days.

(21) Appl. No.: 12/125,176

(22) Filed: May 22, 2008

(65) Prior Publication Data

US 2008/0290266 A1 Nov. 27, 2008

Related U.S. Application Data

(60) Provisional application No. 60/939,505, filed on May 22, 2007.

(51) Int. Cl.
*H01J 37/15* (2006.01)

(52) U.S. Cl. ................................ 250/423 R; 250/396 R

(58) Field of Classification Search ............ 250/492.21, 250/423 R, 424, 396 R
See application file for complete search history.

(56) References Cited

U.S. PATENT DOCUMENTS

| | | | | |
|---|---|---|---|---|
| 5,101,110 | A * | 3/1992 | Matsudo et al. | 250/427 |
| 6,359,286 | B1 | 3/2002 | Ito et al. | |
| 7,060,988 | B2 | 6/2006 | Mack et al. | |
| 7,453,074 | B2 * | 11/2008 | Eisner et al. | 250/492.21 |
| 2004/0188631 | A1 | 9/2004 | Horsky et al. | |
| 2006/0097193 | A1 | 5/2006 | Horsky et al. | |

OTHER PUBLICATIONS

ISR (PCT/US08/64475), Aug. 8, 2008, Semequip, Inc.

* cited by examiner

*Primary Examiner* — Kiet T Nguyen

(74) *Attorney, Agent, or Firm* — John S. Paniaguas; Katten Muchin Rosenman LLP

(57) ABSTRACT

A new type of triode extraction system, a Cluster Ion Beam Extraction System, is disclosed for broad energy range cluster ion beam extraction applications while still being applicable to atomic and molecular ion species as well. The extraction aperture plate contours are set to minimize the beam cross over and at the same time shield the source from excess extraction electric fields thus allowing smaller values of the extraction gap. In addition, a novel focusing feature is integrated into these new optics which allows the beam to be either focused or de-focused in the non-dispersive plane by using a bipolar bias voltage of only a few kV over a broad range of beam energy. This is a superior solution to a standalone electrostatic lens solution, for example an einzel lens, which would require tens of kV of bias voltage in order to be able to focus an energetic beam.

9 Claims, 15 Drawing Sheets

CASE 1

CASE 2

CASE 3

CASE 4

DESCRIPTION OF INVENTION

DESCRIPTION OF INVENTION

DESCRIPTION OF INVENTION

Figure 5a. Transverse electric field $E_x$ and space charge field $E_{SPC}$ plotted as a function of beam velocity.

Figure 5b. Experimental comparison between traditional Pierce- type extraction geometry and the Cluster Ion Beam Extraction System. In both cases a model 350 Cluster Boron source was used in the measurements.

DESCRIPTION OF INVENTION

DESCRIPTION OF INVENTION

DESCRIPTION OF INVENTION

DESCRIPTION OF INVENTION

Figure 9a. Modeled transverse electric field components $E_y$ at two different y- heights for the geometry shown in figure 7, when the extraction aperture plate is in 80 kV potential, suppression electrode is in -2 kV and the extraction gap measured from the knife edge to the tip of puller is 115 mm.

DESCRIPTION OF INVENTION

DESCRIPTION OF INVENTION

DESCRIPTION OF INVENTION

METHOD AND SYSTEM FOR EXTRACTING ION BEAMS COMPOSED OF MOLECULAR IONS (CLUSTER ION BEAM EXTRACTION SYSTEM)

CROSS REFERENCE TO RELATED APPLICATIONS

This application claims the priority to and the benefit of U.S. Provisional Patent Application No. 60/939,505, filed on May 22, 2007, hereby incorporated by reference.

BACKGROUND OF THE INVENTION

1. Field of the Invention

The invention relates to an ion optical system that extracts and forms an ion beam which can be used for ion implantation processes, particularly in the low energy range 100 eV-4 keV. The invention enables a broad energy range of the transported ion beam and also enables the extraction of molecular ions as well as more conventional monomer ion beams using a simple triode extraction structure. Novel features are incorporated into the invention that enable beam formation and variable focusing of ion beams over a very broad range of beam current, ion mass and source brightness, while being compatible with many commercial beam line implantation platforms.

2. Description of the Prior Art

—Ion Implantation Process

The ion implantation process relies on ionizing gaseous or vaporized solid feedstock material in an ion source and extracting either positive or negative ions from the source through an extraction aperture using electric fields. The beam is then mass analyzed, transported and implanted to target semiconductor wafer.

—Ion Source and Extraction

In traditional implanter ion sources, arc discharge or RF excitation is typically used to form a dense plasma, which is a mix of thermal electrons, fast ionizing electrons, and ions. FIG. 1 shows a schematic of a traditional plasma ion source used in implanters. The ion beam is extracted from the source through an opening in the source wall. The extraction aperture shape is traditionally a slot with a width of a few millimeters and height of few tens of millimeters. The ion source and extraction aperture plate are typically at the same potential, but sometimes a voltage is applied between the two. A suppression electrode that is at negative potential is used to form the electric field that pulls the ions out of the source. It also creates a potential barrier for back streaming electrons that are formed downstream through beam impact on surfaces or background gas ionization. A third electrode follows the suppression electrode which is at the ground potential.

Typically the suppressor and the ground electrode are a movable unit in order to change the gap between the extraction aperture plate and the suppression electrode. This is required as the ion beam final energy, which is set by the source potential, is varied and the electric field in the extraction gap has to be adjusted accordingly in order to maintain the same extraction conditions for the ion beam. This relation stems from the fact that the extracted current density depends on the extraction electric field through Child's law:

$$j = 1.72\sqrt{\frac{Q}{M}}\frac{U^{3/2}}{d^2}[\text{mA/cm}^2], \tag{1}$$

Where j is the maximum extractable current density of the ion beam, Q and M are the charge state and the mass number of the ion and U [kV] and d [cm] are the applied voltage and gap between the ion source body/extraction aperture plate and the suppression electrode, respectively. Child's law gives the space charge limit for the extractable current density from the ion source.

FIG. 2 shows a schematic of a typical ion implanter extraction system. The ion extraction aperture is either a round aperture or a slot with a chamfer on the downstream side of the aperture. This chamfer angle α varies typically from 35 to 75 degrees, most typically a so-called Pierce angle of 67.5 degrees is used. The thickness of the extraction aperture plate is normally 6 mm or less. The shape of the suppression/extractor electrode often features a protruding lip that can be brought into close proximity to the aperture plate. The schematic of FIG. 2 is represents typical dispersive (horizontal) plane optics. In the non-dispersive (vertical) plane the extraction slot is usually much taller than the dispersive plane width of the slot, making the dispersive and non-dispersive plane optics separable in their mathematical representation. To effect non-dispersive plane focusing of the beam, the extraction aperture plate and the suppression and ground lips are typically curved. The radius of curvature (along the long axis) is optimized to match the beam acceptance of the analyzer magnet and subsequent beam line.

FIG. 3 shows a schematic of typical non-dispersive plane electrode shapes. The beam analyzer magnet focuses the beam in the dispersive plane. The beam width at the exit of the analyzer dipole magnet is related to the width of the beam at the entrance of the magnet by equation 2:

$$y_2 = y_1 \cos(\alpha_1), \tag{2}$$

Where $y_1$ and $y_2$ are the beam half-widths at the entrance and exit field boundaries, respectively, and $\alpha_1$ is the magnet sector angle. If the sector angle is smaller than 90 degrees, the beam leaves the magnet converging. At a 90 degree sector angle the beam has a focal point at the magnet exit, and with a sector angle larger than 90 degrees the beam has a focal point inside the magnet and leaves the magnet diverging.

The requirement set for the extraction optics will be the ability to form a beam that has small enough divergence and beam size in the dispersive plane to match the acceptance of the analyzer magnet. In the non-dispersive plane, the beam focusing can be accomplished by the curvature of the electrodes, but additionally the analyzer magnet can have some focusing properties either through pole rotation or pole face indexing.

—Space Charge Forces

It can be problematic to achieve a desired beam focusing in the non-dispersive plane if the space charge of the beam is varying significantly between different operation modes of the extraction system. The space charge of the beam depends on beam energy and current. The transverse space charge force $F_{SPC,SLIT}$ acting on the envelope of the ion beam can be written for a slit beam in a following form:

$$F_{SPF,SLIT} = \frac{eJ}{2\varepsilon_0 v} \tag{3}$$

In equation (3), e is the elementary charge, J is the beam current per unit length of the slot, $\epsilon_0$ is the permittivity of free space and v is the directed velocity of the particle along the beam direction. For round beam the same equation can be written in form:

$$F_{SPC,ROUND} = \frac{qI}{2\pi\varepsilon_0 v r_0} \quad (4)$$

where q is the total charge of the ion, I is the beam current and $r_0$ is the beam envelope radius.

The space charge forces described in equations (3) and (4) are transverse forces with respect to the beam direction, which will blow up the beam as it drifts in the beam transport system. This has implications for the extraction of the ions from the ion source. Ideally, the extraction optics should be designed so that the resulting electric fields will compensate the transverse space charge force and form an approximately parallel, or only slightly diverging, beam in the dispersive plane, while focusing or containing the beam envelope in the non-dispersive plane.

In typical ion implanters atomic ion species are used to form the implanted beams of boron, arsine and phosphorus. The extracted current densities can be in the range of a few $mA/cm^2$ and higher. This sets boundary conditions for the design of the extraction optics in the existing implanters. Typically slit extraction is used with slit sizes of a few mm in width (dispersive plane) and 20-40 mm in height (non-dispersive plane). The extraction gap between the aperture plate and the suppression electrode typically varies from a few mm to a few tens of mm when the beam energy is in the range used in implanters, which is from a few hundred eV to 80 keV.

SUMMARY OF THE INVENTION

Traditional triode extraction systems with thin ion extraction aperture plates have been proven to work acceptably for high current density extraction systems when using atomic or small molecular species ion beams. The development of cluster ion beams (for example, $B_{18}H_x^+$, $B_{10}H_x^+$, $C_7H_x^+$) for next generation implanter technology, however, has exposed the inadequacy of traditional extraction optics for this application. For low current density beam extraction, the thin plate optics setup is poorly matched, especially at higher energies. Extracted $B_{18}H_x^+$ current densities are typically between 0.5 and about 1 $mA/cm^2$, which is quite low compared to many plasma ion sources used in ion implantation. In order to extract the desired ion currents the extraction slot has a larger area (for example, 10 $cm^2$ or more), which creates a sizable punch-through of the extraction electric field into the ion source. To achieve a matched extraction condition, the extraction gap has to be very large to reduce the effect of this punch-through. Especially at high extraction voltages >10 kV, the beam will cross over strongly and hit the suppression and ground electrodes. The strong cross over also leads to high beam divergence which increases beam losses in mass analyzer magnet and in the following beam line due to beam vignetting, i.e., beam intersection with beam line apertures.

To overcome these issues a new type of triode extraction system, a Cluster Ion Beam Extraction System, has been developed for broad energy range cluster ion beam extraction applications while still being applicable to atomic and molecular ion species as well. The extraction aperture plate contours are set to minimize the beam cross over and at the same time shield the source from excess extraction electric fields thus allowing smaller values of the extraction gap. In addition, a novel focusing feature is integrated into these new optics which allows the beam to be either focused or defocused in the non-dispersive plane by using a bipolar bias voltage of only a few kV over a broad range of beam energy. This is a superior solution to a stand-alone electrostatic lens solution, for example an einzel lens, which would require tens of kV of bias voltage in order to be able to focus an energetic beam.

DESCRIPTION OF THE DRAWINGS

These and other advantages are described in the following specification and attached drawing wherein.

DETAILED DESCRIPTION

Figure 1:
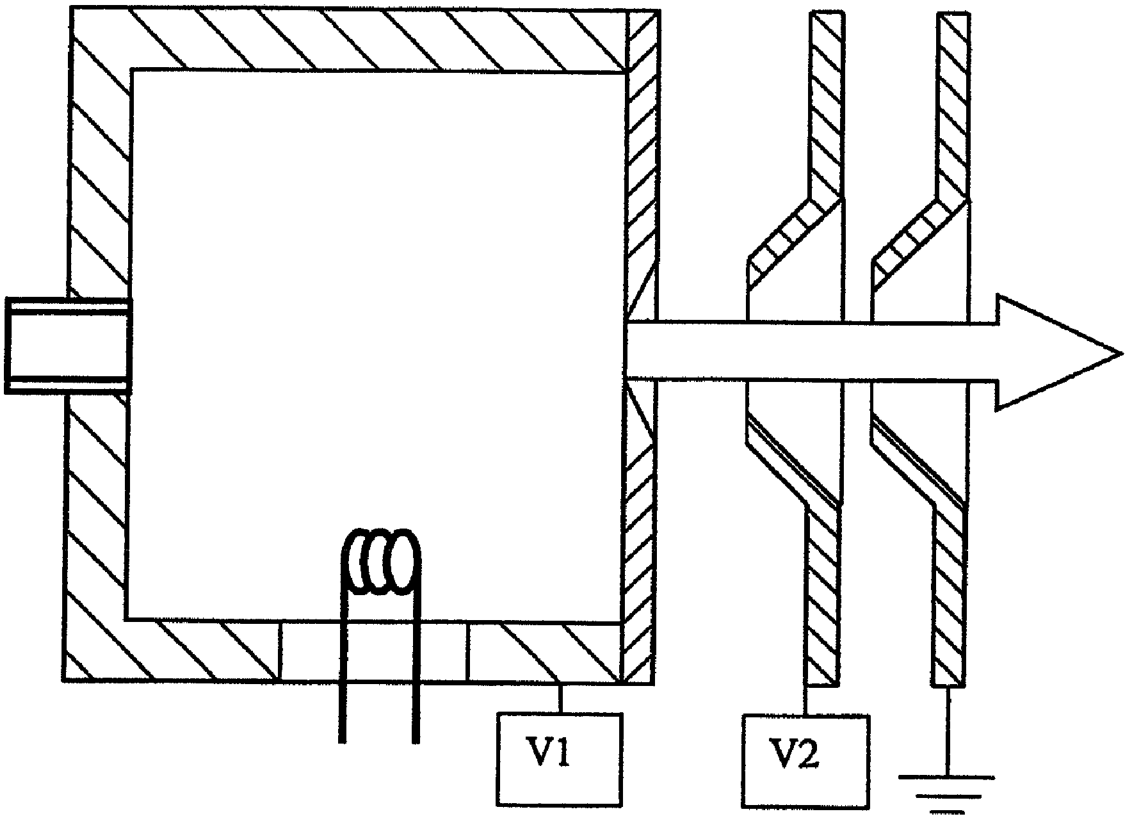
FIG. 1 PRIOR ART
FIG. 1 is a schematic of a traditional plasma ion source used in implanters.

FIG. 1 shows a schematic of a traditional plasma ion source used in implanters. An ion source consists of a vacuum chamber, material feed port, ion extraction slot and ionization mechanism. The size of the chamber varies depending on the size of the ion beam that is created. Source material is fed into the source chamber either in vapor or gaseous form. The neutral feedstock is ionized using one of the following methods: arc discharge in several variations, RF- or microwave excitation or electron impact ionization. The created ions are extracted from the source through an opening in one of the source chamber walls.

Figure 2:
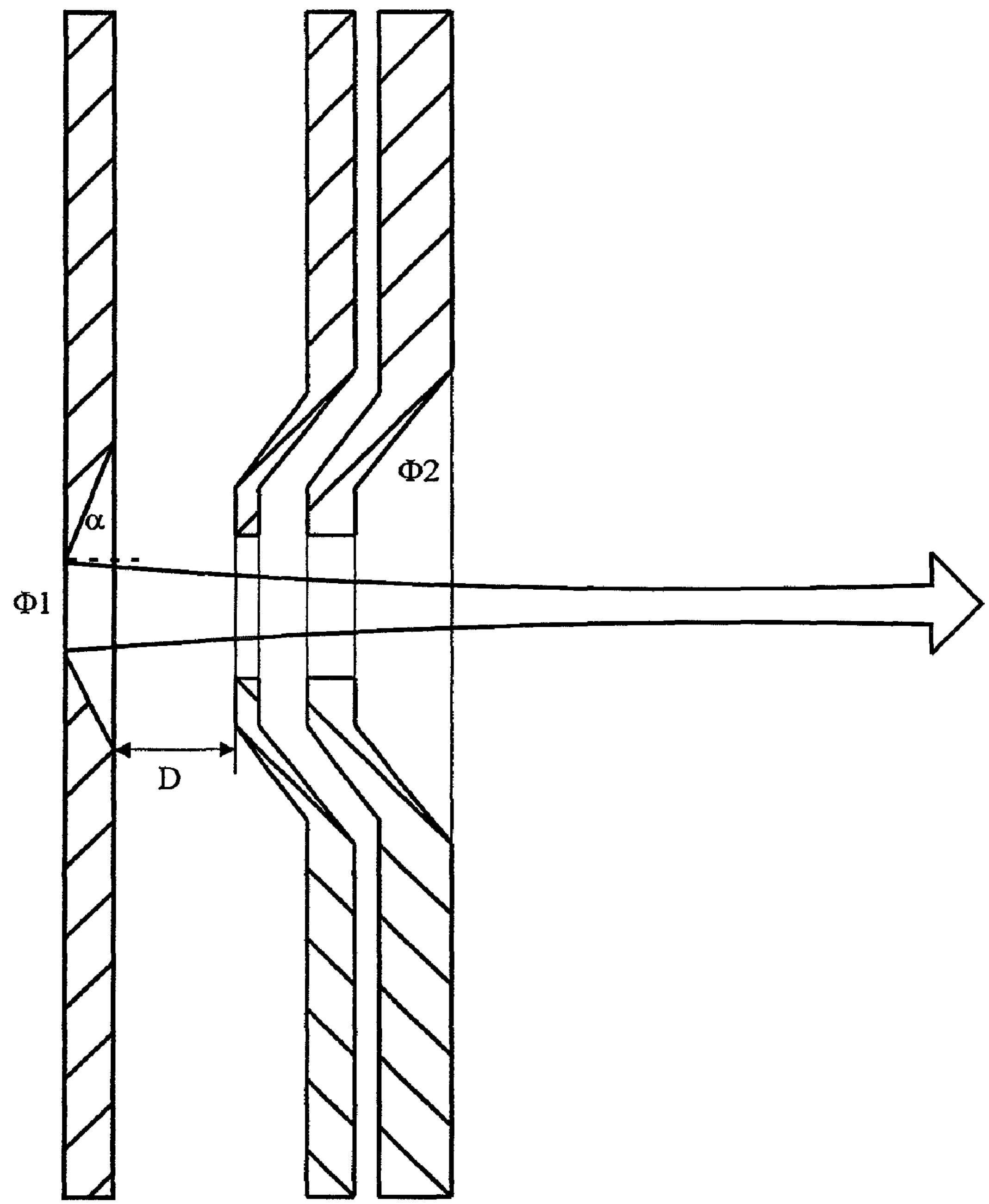
FIG. 2 PRIOR ART
FIG. 2 is a cross section of a typical ion implanter extraction system in dispersive plane.

FIG. 2 shows a cross section of a typical ion implanter extraction system in dispersive plane. The horizontal or dispersive plane cross section shown is a representation of typical ion extraction system that is widely used in ion beam implantation. The extraction aperture size and shape can vary from application to application. High current density plasma sources will run smaller apertures, whereas lower density molecular sources require larger extraction area to produce commercially viable amounts of beam current. Typically the extraction opening is a slot which is anywhere from 5 to 10 times taller than it is wide. The extraction aperture plate has typically an angle α at the downstream side with respect to the beam direction. This angle typically varies around the so called Pierce-angle of 67.5 degrees, which has been shown to be optimum angle for electron beam extraction from solid emitter surfaces. The extraction aperture plate is in higher potential than the following suppression electrode. This potential difference creates an electric field that accelerates the ions out of the source. The suppression electrode, which is biased in negative potential for positive ion extraction, creates a negative potential barrier which prevents back streaming electrons from being sucked into the ion source from the beam line. This trapping of electrons will not only lower the power load of the back streaming electron beam but the trapped electrons are sucked into the positive ion beam potential and lower the space charge of the beam. This so called space charge neutralization is widely used in beam transport to overcome the internal space charge limits of the beam. For negative ion extraction the source is in more negative potential than the suppressor, which sits in positive potential. This will trap positive ions into the beam, which will neutralize the negative ion space charge.

The suppression and ground electrodes are typically moved along the beam direction. This allows a proper electric field value to be achieved when the ion beam energy and extraction voltages or the extracted ion current density are changing.

Figure 3:
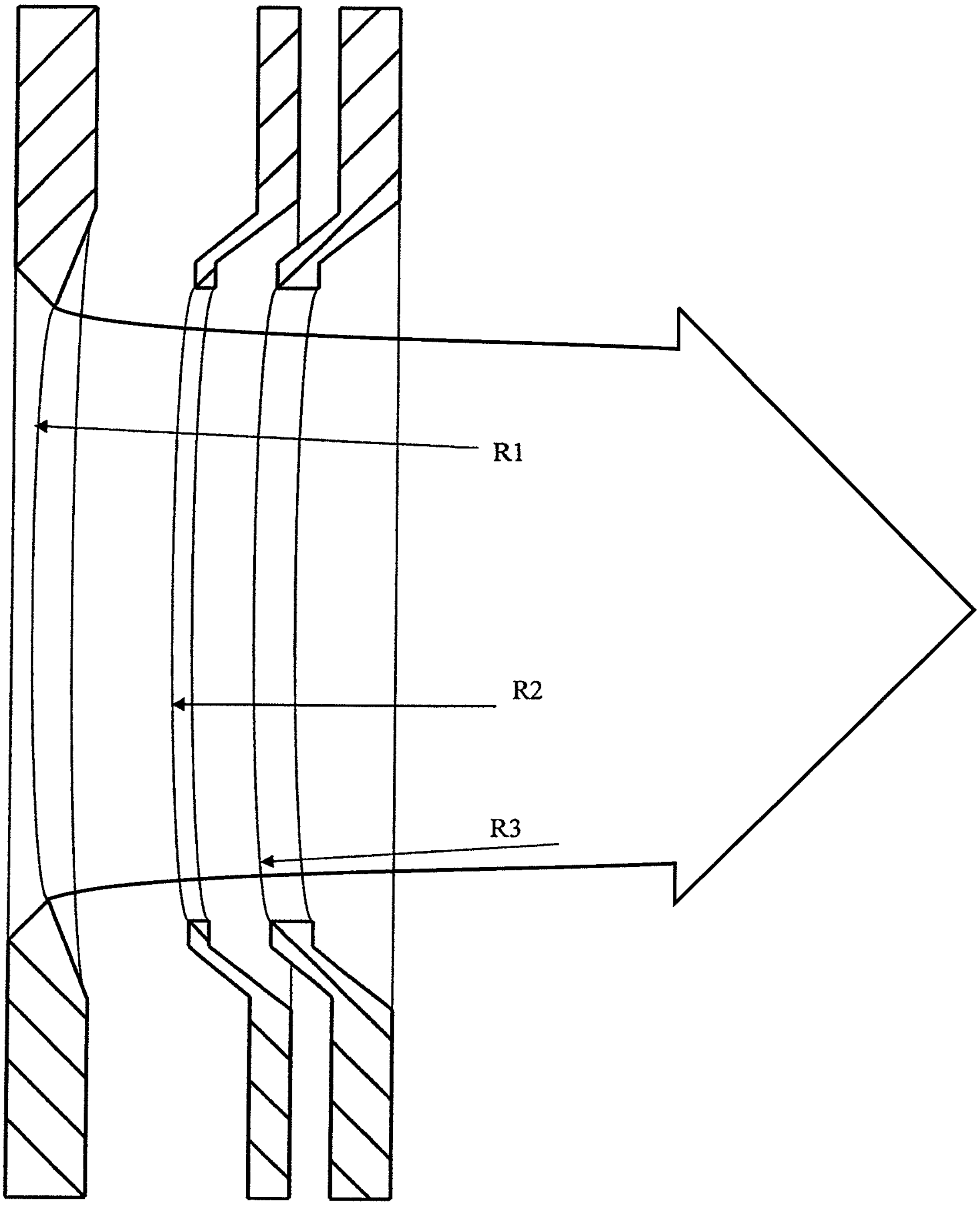
FIG. 3 PRIOR ART
FIG. 3 is a non-dispersive plane cross section of ion implanter optics.

FIG. 3 shows a non-dispersive plane cross section of ion implanter optics. In typical ion implanter optics the ion beam is several times taller in the non-dispersive plane than it is wide in the dispersive plane. To focus the beam down vertically, the extraction aperture plate, suppression and ground electrodes are curved to give geometrical focusing for the beam. The focal length of the beam depends on the radius of curvature used in the electrodes and to some extent the beam current and energy. Low energy and/or high current beams have larger space charge effects in which case smaller radius of curvature is required to focus them down to the same focal point as a high energy and/or low current beam.

Figure 4:
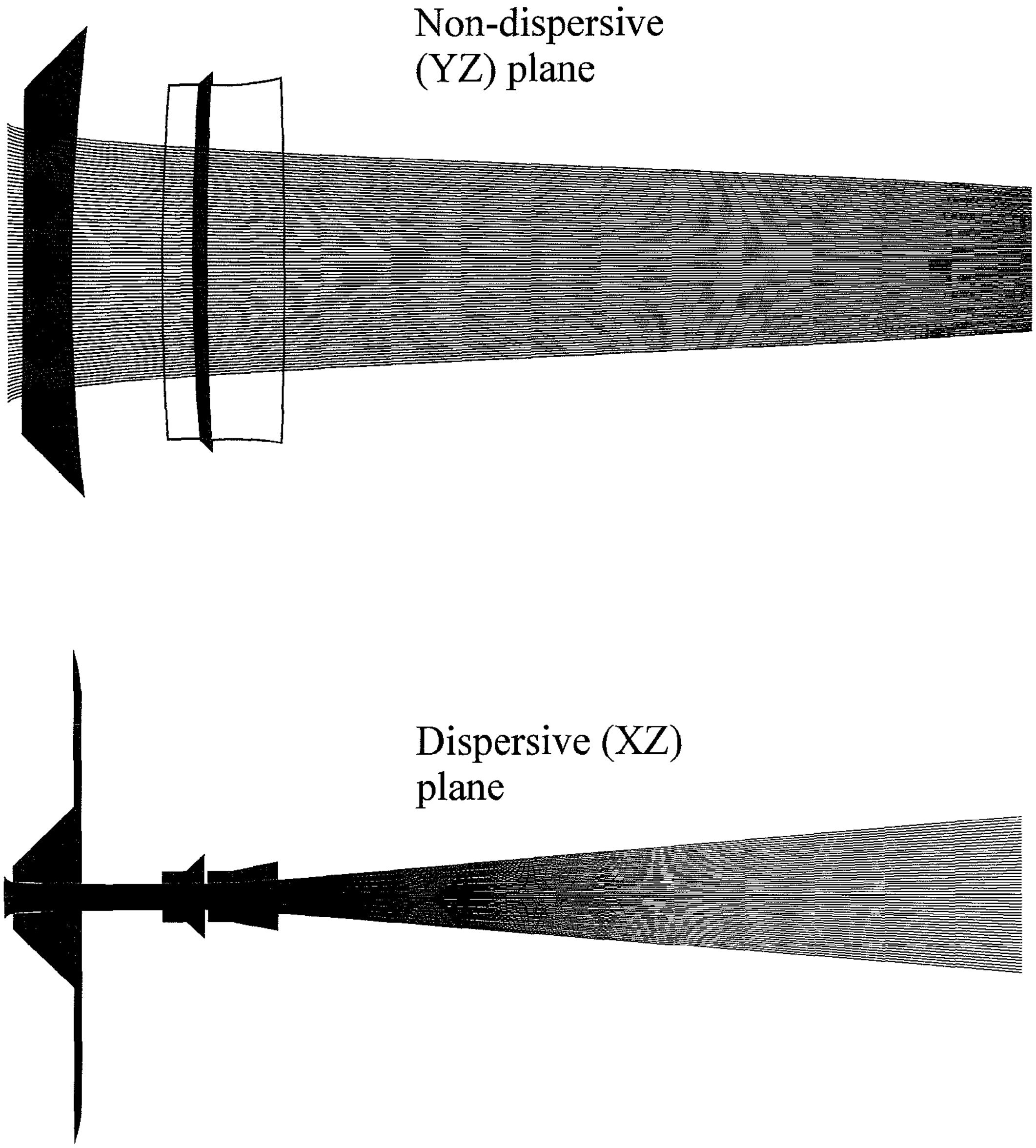
FIG. 4 is a schematic of the new Cluster Beam Optics.

The extraction system of the invention herein described was designed to match 4 to 80 keV (0.2 to 4 keV boron equivalent energy) $B_{18}H_x^+$ beams with 0.5 to 0.7 mA/cm$^2$ current density and a maximum allowed extraction gap of about 100 mm. FIG. 4 shows a cross section in the middle dispersive plane of this new extraction system. The extraction slot in this exemplary case is 10 mm wide in the dispersive plane and 100 mm tall in the non-dispersive plane. The model is a full 3D boundary element simulation of an extracted ion beam, including space charge effects.

A dispersive and non-dispersive plane cross section of the invention is shown in FIG. 4. To accommodate the lower current densities of the cluster ion beams in comparison to traditional plasma source produced ion beams, the dispersive plane features adjacent to the extraction aperture are modified. To minimize over focusing as the beam leaves the extraction slot, a flat 90 degree section is cut from the edge of the slot instead of a 67.5 degree or similar tapered cut that is traditionally used in ion implanter extraction systems. The flat section on each side of the extraction slot is of similar size as the half width of the slot. A tapered cut starting from the outer edge of the flat section opens up a trench through the thickness of the aperture plate. The angle of this cut is 45 degrees, but this angle can be optimized for each extraction system depending on the energy/beam current range that the implanter will be optimized for. The cut angle can also vary throughout the thickness of the plate. The suppression and ground inserts are beak-like lips which allows the suppression feature to be pushed into the extraction aperture plate trench in low energy operation, where the extraction gap will be small. In general the suppression and ground insert shapes are not very critical for the cluster ion beam optics. The extraction aperture plate and the suppression and ground inserts are curved in the non-dispersive plane to give the beam geometrical focusing.

Figure 5:
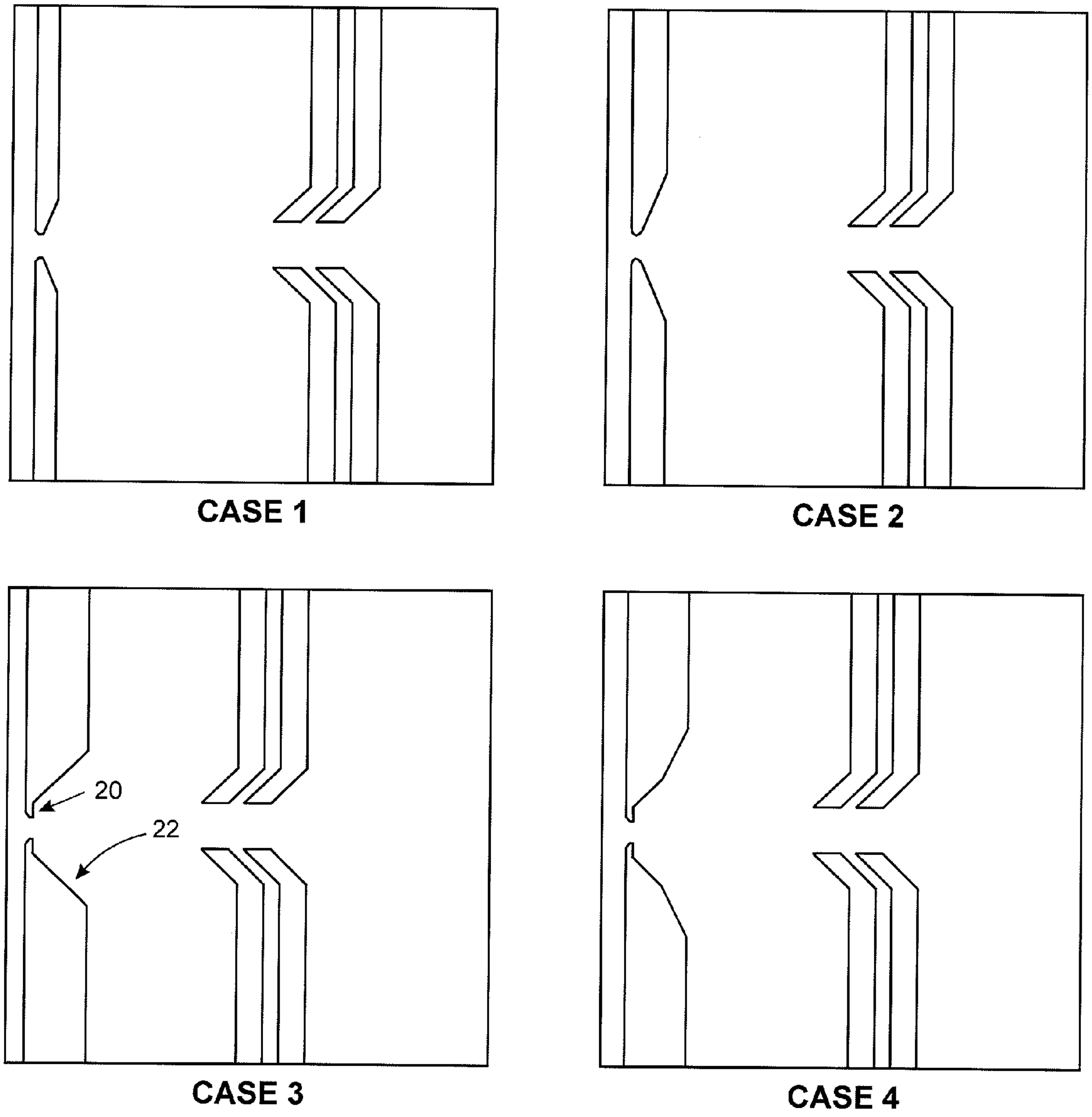
FIG. 5 illustrate dispersive plane cross sections of two variations of the Cluster Ion Beam Extraction System and two variations of traditional extraction optics.

The prominent features of the extraction aperture plate are the flat middle section around the extraction slot, the 90 degree included angle and the thick profile of the extraction aperture electrode. Referring to FIG. 4, the 90 degree angle is measured with respect to a vertical axis as illustrated in FIG. 2. Referring to FIG. 5 and specifically the bottom two Figures, the flat portion, identified with the reference numeral 20, refers to the portion illustrated as spaced apart tips relative to the upstream edge of the extraction aperture plate. The trench portion, identified with the reference numeral 22, is immediately downstream of the flat portion The flat middle section that surrounds the extraction slot helps to form uniform axial (along beam direction, z-axis) electric field over the slot area and minimizes the transverse (x- and y-axis) field components. The transverse field component is responsible for over focusing of the beam near the extraction slot, so this should be minimized. The height of the flat at the ends of the slot in the non-dispersive plane can be varied: more flat increases the vertical focal length of the optics, less flat reduces it.

The 90 degree included angle creates a deep channel to shield the excess electric field while at the same time enabling the electric field to have optimum profile across the ion beam, thus minimizing beam divergence and producing a brighter beam. The included angle should be matched to the space charge of the beam so that the force created by the transverse electric field components match or only slightly exceed the intrinsic transverse space charge force of the beam.

The front plate, puller and ground inserts have a radius of curvature in vertical YZ-plane to optimize the vertical focal length. In the presented extraction system the radius of curvature of the front plate is 1000 mm.

FIG. 5 shows dispersive plane cross sections of two variations of the Cluster Ion Beam Extraction System and two variations of traditional extraction optics. The Cluster Ion Beam Extraction System in two geometry variations is compared to two traditional Pierce-type geometries. Both of the Pierce geometries use a standard 67.5 degree electrode angle, the extraction aperture plate thickness in case 1 is 5 mm and 10 mm in case 2. Both the Cluster Ion Beam Extraction System variations, case 3 and 4, have 20 mm thick extraction aperture plates.

The flat section adjacent to the extraction aperture is identical for cases 3 and 4. In case 3 the extraction trench has a uniform angle throughout the thickness of the plate, whereas in case 4 the angle is similar to case 3 up to halfway through the thickness of the plate after which the angle increases. The electric fields generated by each 4 geometries were modeled using Lorentz EM electromagnetic solver and the transverse component $E_x$ is plotted in FIG. 5*a*. In each case the extraction aperture plate was in 60 kV potential and the suppression electrode was in −5 kV potential.

As an example 2 variations of a traditional extraction electrode design and 2 variations of the new optics were modeled using Lorentz-EM and are presented. FIG. 5 shows 2-dimensional cutouts of the geometries at the dispersive middle plane of the extraction slot. To describe quantitatively the optics, the focusing transverse electric field component $E_x$ is plotted as a function of the ion velocity for a singly charged positive ion and compared to the opposing space charge force that tries to blow the beam up. The electric field is plotted along a line starting from the outer edge of the extraction slot, which is in this example 10 mm wide. The ion current/unit length of the slot is assumed to be about 0.7 mA/cm which corresponds to a typical $B_{18}$ current density of 0.7 mA/cm$^2$. The extraction gap is defined as the distance from the knife edge of the extraction slot to the tip of the suppression/puller electrode, and is varied in each geometry to give the same axial electric field value $E_z$ at the extraction plane. The potentials on the extraction aperture, suppression and ground electrodes were 60, −5 and 0 kV, respectively.

Figure 5A:
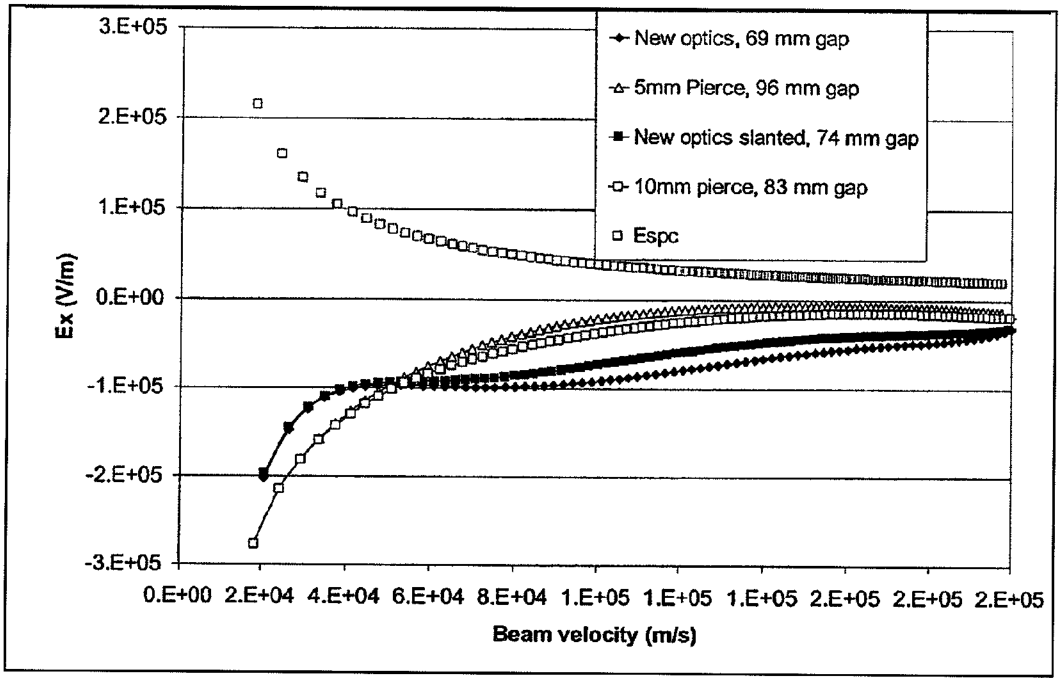
FIG. 5*a* illustrates a transverse electric field $E_x$ and space charge field $E_{SPC}$ plotted as a function of beam velocity.

FIG. 5*a* plots the resulting transverse electric field and the space charge generated electric field $E_{SPC}$, which is given by dividing equation 3 by elementary charge e:

$$E_{SPC} = \frac{F_{SPC,SLIT}}{e} = \frac{J}{2\varepsilon_0 v} \tag{5}$$

In order to form a parallel beam, $E_x$ and $E_{SPC}$ have to be approximately equal in strength and opposite in sign throughout the acceleration of the ion. As can be seen from FIG. 5*a*, the traditional Pierce-type geometries, where the extraction aperture plate is either 5 mm or 10 mm thick in this case, $E_x$ is larger than the space charge field $E_{SPC}$ in the beginning. This will over-focus the beam as it leaves the source. At larger beam velocities $E_x$ is smaller than $F_{SPC}$/e, which will let the beam to blow due to the space charge. The accumulative effect is a strongly diverging beam that is hard to transport through the rest of the beam line.

For the new Cluster Ion Beam Extraction System, $E_x$ starts at very similar strength as the space charge field and follows in general the same trend throughout the acceleration. In this specific example the 90 degree included angle geometry creates slightly high $E_x$ in intermediate ion beam velocity. This is often desirable as the slight excess in $E_x$ will focus down the beam in dispersive plane and thus help form a smaller beam entering the analyzer magnet. This effect can be also toned down by making a larger included angle cut to the extraction channel. Looking at the $E_x$ values in these 2 cases it is clear that the flat edge adjacent to the extraction slit helps to minimize the critical over-focusing in the beginning, and maintains a good balance between $E_x$ and $E_{SPC}$ through the rest of the beam acceleration, which will result in less diverging beam that is easier to transport than the beam created by a traditional Pierce-type geometry.

Another significant difference between the traditional Pierce-geometry and the new optics can also be seen from the above example. The extraction gap that is needed to accommodate high energy beams is significantly smaller in case of the new geometry. In the traditional Pierce-geometry where the extraction gap is overly large the beam will have more time to blow up and strike the suppression and ground inserts. This effect is only made worse by the larger divergence introduced by this type of traditional geometry. The required axial movement of the suppression and ground electrodes is also reduced as well as the space requirement.

Two of the geometries that were presented in the example of FIG. 5 and FIG. 5*a* were experimentally compared. The geometries of choice were the 5 mm thick Pierce-geometry and the non-tapered new optics with a uniform 90 degree included angle.

Figure 5B:
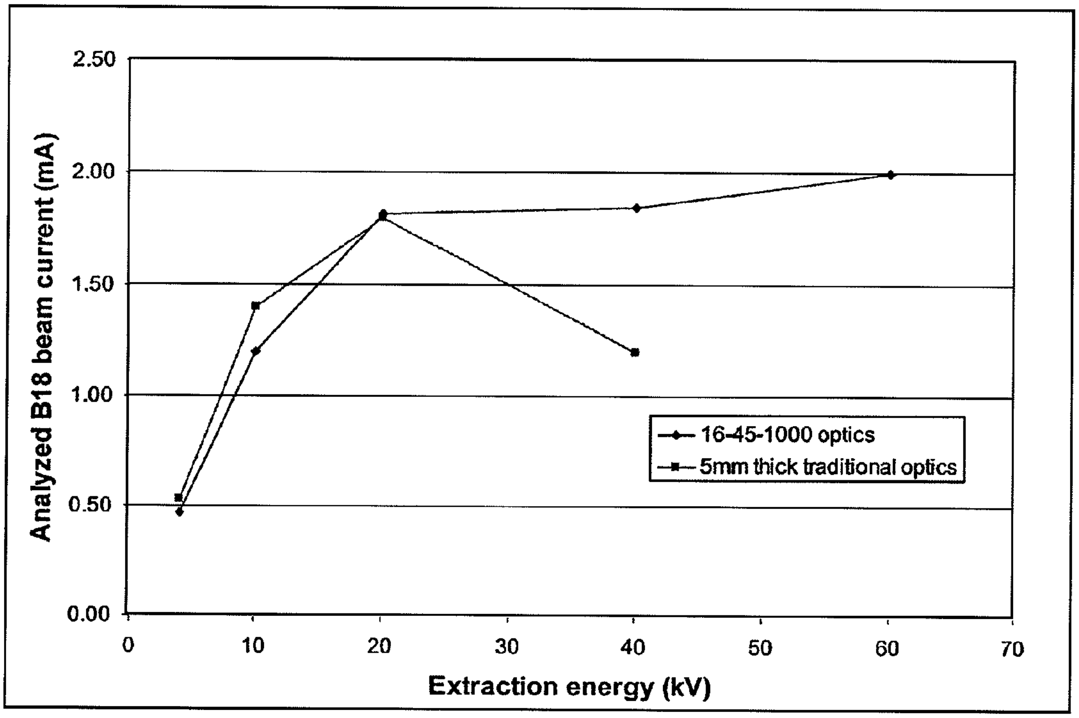
FIG. 5*b* is an experimental comparison between traditional Pierce-type extraction geometry and the Cluster Ion Beam Extraction System.

As can be seen from FIG. 5*b* the new Cluster Ion Beam Extraction System performs as well as the traditional one at low energies. At high extraction energy the traditional optics runs into problems as the beam divergence increases and significant part of the beam is lost through beam strike on the suppression electrode and at the entrance and inside the analyzer magnet. Several radii of curvatures were tested for the traditional optics and none of them could cover the whole energy range for the $B_{18}H_x^+$ beam. The new optics was pulling consistently much less suppression current, which is an indication of the amount of beam strike on the suppression electrode. This lowers the back streaming electron current into the ion source thus lowering the x-ray emission significantly at higher extraction energies.

Figure 6:
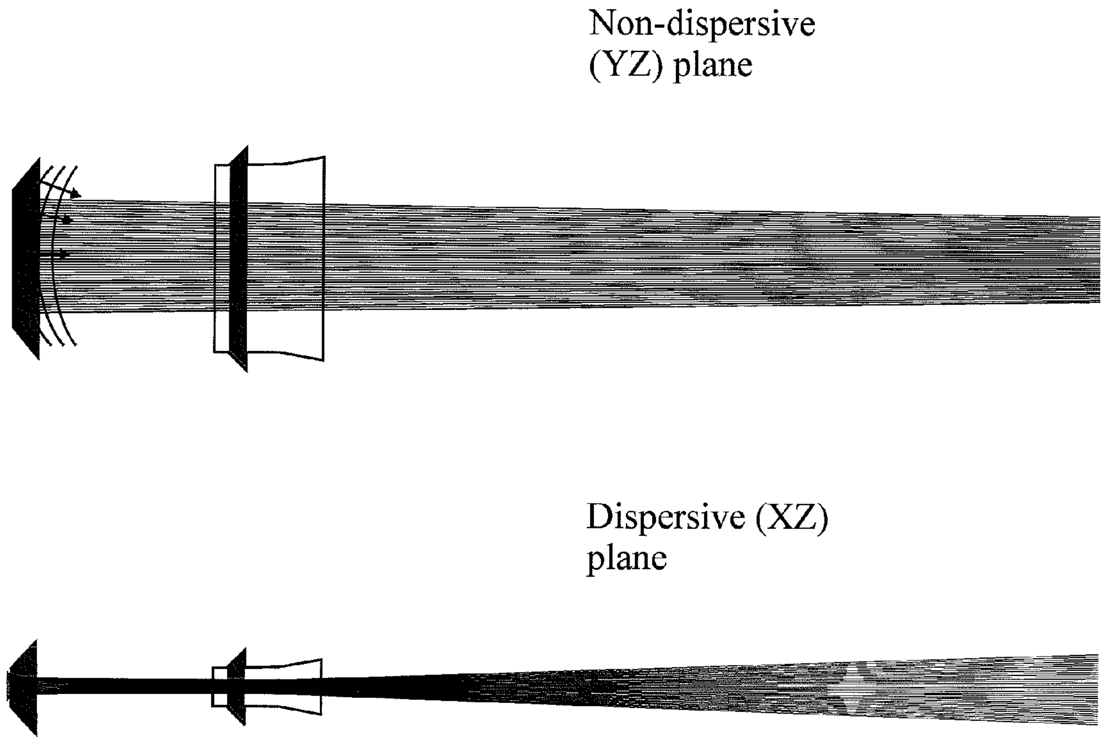
FIG. 6 illustrates a Cluster Ion Beam Extraction System with smaller extraction aperture

The size and shape of the extraction slot can vary greatly in the new optics. The features described in FIG. 4 will still work when the size of the extraction slot is changed as long as the features are scaled with the rest of the geometry. FIG. 6 shows an example of this. The extraction slot size is 8×48 mm. The smaller extraction slot in conjunction with the depth of the extraction channel will allow the electrodes to be flat without any curvature.

The aperture plate is thinner overall and the flat sections adjacent to the extraction slot are smaller. In the dispersive plane the optics features are similar to the case presented in FIG. 4. In the non-dispersive plane, there is a major difference as there is no vertical curvature in the extraction aperture plate or suppression/ground inserts. The aspect ratio of the extraction trench is such that the electrostatic potential and electric field distribution is similar to what can be achieved with curved electrodes. This is illustrated with constant potential lines and electric field vectors sketched into the non-dispersive plane cross section.

The channel shape provides electric field distribution which will focus the beam sufficiently in the non-dispersive plane. The suppression and ground electrodes are also without curvature. This type of smaller extraction slot is better suited for plasma ion sources, where a large aperture is undesirable as dense plasma can blow-out of the source and form a plasma bridge between the source and suppression potential very easily.

A flat middle section around the extraction slot is maintained to reduce beam divergence. As the front plate is thinner than in the geometries presented above due to smaller extraction slot size the flat part can be uniform all around the slot.

Electrostatic Ion Optical Lens Integrated into the Cluster Ion Beam Extraction Aperture Plate At different beam energies and beam currents the focal length of the triode system described here can vary significantly due to varying space charge effects of the beam. At the dispersive (XZ) plane this variation is controlled by changing the extraction gap and suppression voltage. In the non-dispersive (YZ) plane these adjustments are not effective due to the height of the beam. This is a problem when transporting the beam long distances (through an analyzer magnet) to a beam line with limited acceptance. To better control the beam optics without adding additional electrodes or bulky magnetic lens elements a simple solution for controlling the y-focusing is presented here.

Figure 7:
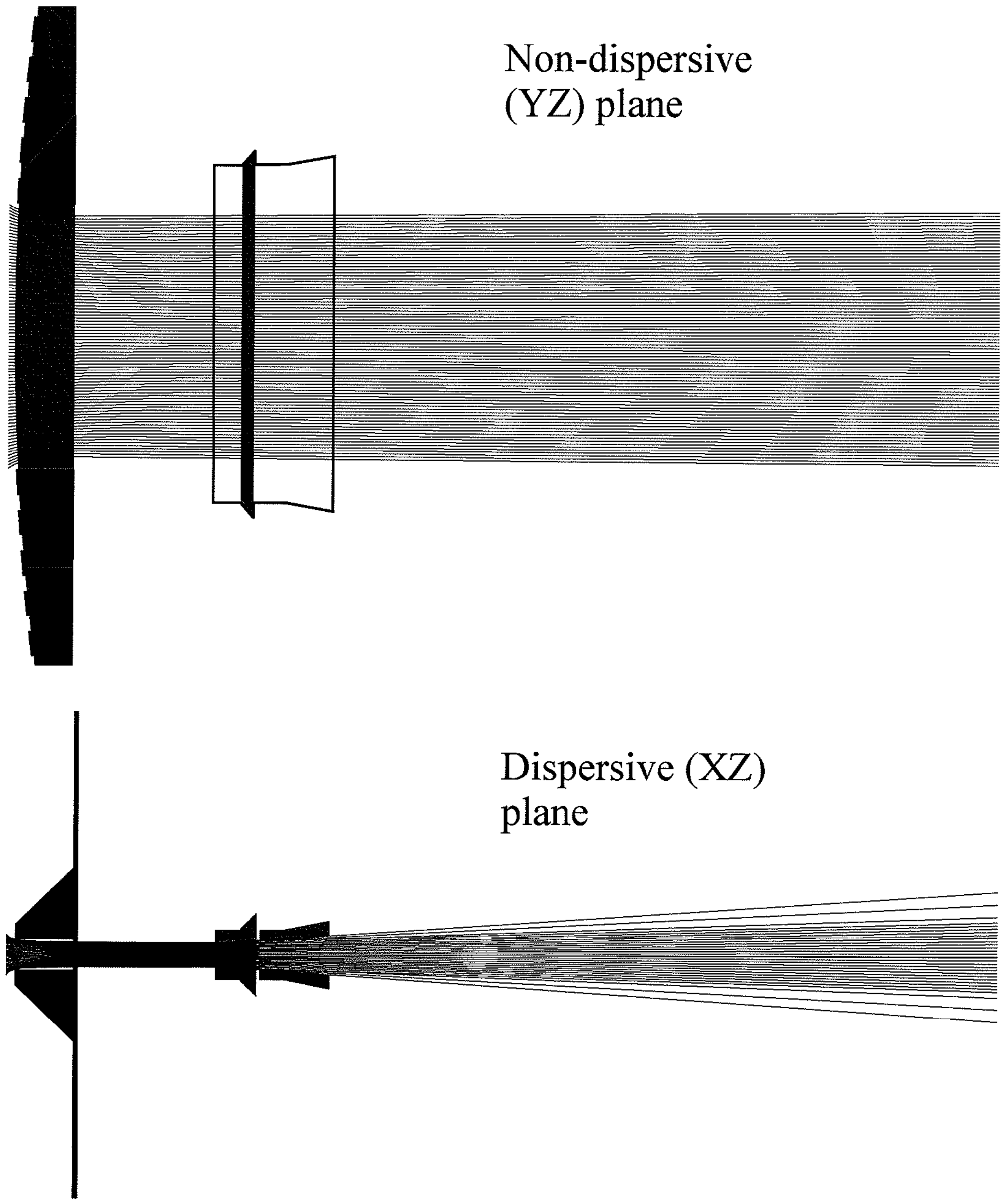
FIG. 7 illustrates an integrated vertical focusing lens on the Cluster Ion Beam Extraction System.

FIG. 7 shows integrated vertical focusing lens on the Cluster Ion Beam Extraction System. The extraction aperture plate is otherwise identical to the one shown in FIG. 4, but in this modified version the extraction aperture plate is formed in separate plates, such as a main plate which includes the extraction aperture and one or more separate plates. For example, the extraction aperture plate can be formed with top and bottom plates that are electrically isolated from the main plate, which is illustrated with cut lines. The main plate includes the extraction aperture. This allows biasing of these separate elements, which will form an electrostatic lens which either focuses or defocuses the ion beam in vertical plane when the elements are biased either positively or negatively with respect to the main plate. A bi-polar power supply with modest voltage range of about ±2 kV is sufficient to focus $B_{18}$ beam with energy range varying from 4 keV to 80 keV. The current requirement of the lens supply is low, as the elements are not exposed to the source interior and are well out of direct path of the beam.

By biasing the top and bottom section positively with respect to the front plate a transverse electric field component which will focus the extracted ion beam in the non-dispersive plane is formed. If a negative bias voltage is added to the lens elements this will increase the focal length of the triode and act as a defocusing lens. Bi-polar voltage supply with modest ±2 kV voltage range is sufficient for the lens to work effectively at all energies, currents and ion species used in ion implantation. The bias voltage has minimal effect on the beam in dispersive plane even when bias voltage is applied, and when no bias is present the lens extraction aperture plate functions identically to the standard plate shown in FIG. 4.

Beam Emittance

Figure 8:
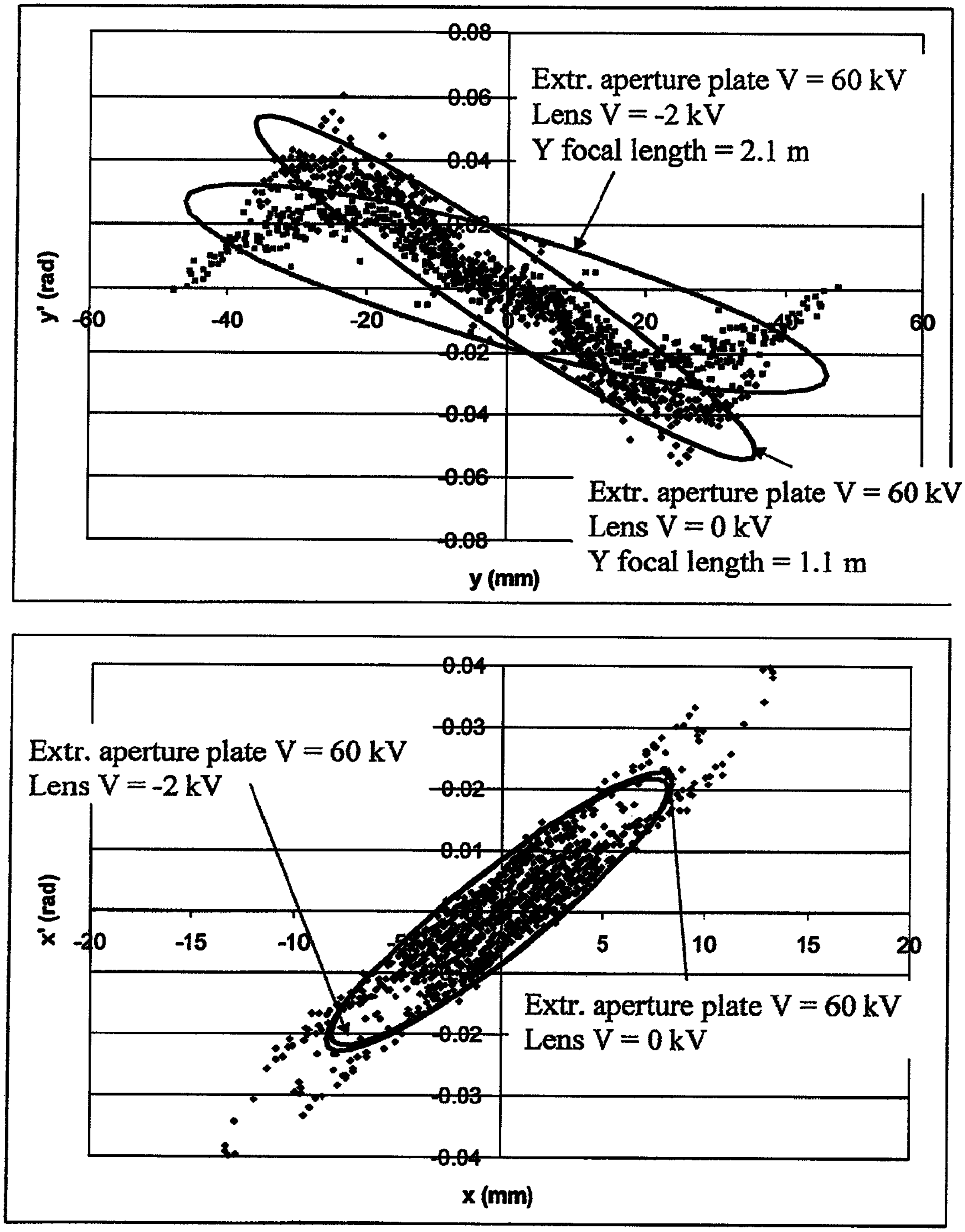
FIG. 8 are modeled beam emittance graphs for the lens optics of FIG. 7.

FIG. 8 shows horizontal and vertical emittance patterns from the beam formed from the electrostatic optics of FIG. 7. The simulation assumed a 60 kV source potential and −2 kV suppression potential. The figures show the beam emittance at z=40 cm from the extraction slot when no lens bias is applied and when a negative −2 kV bias is applied in order to defocus the beam vertically. The horizontal or dispersive plane emittance stays identical when the lens is biased to −2 kV potential indicating that the vertical lens indeed has negligible effect on horizontal behavior of the beam. In vertical plane the beam y-focal length (the beam has the minimum height at the focal point) is 1.1 m when no lens voltage is applied. Negative bias of −2 kV on the lens elements defocuses the beam significantly so that the focal length is now 2.1 m, a significant change.

The split lens of FIG. 7 gives a very effective way to linearly and continuously fine tune the ion beam and match it correctly through the analyzer magnet to the following beam line. FIG. 8 also illustrates the minimal effect of the integrated extraction aperture lens on the beam in dispersive (XZ) plane. In this plane the divergence can be effectively controlled by adjusting the suppression voltage and extraction gap, thus giving independent control over YZ- and XZ plane focusing of the beam.

Figure 9:
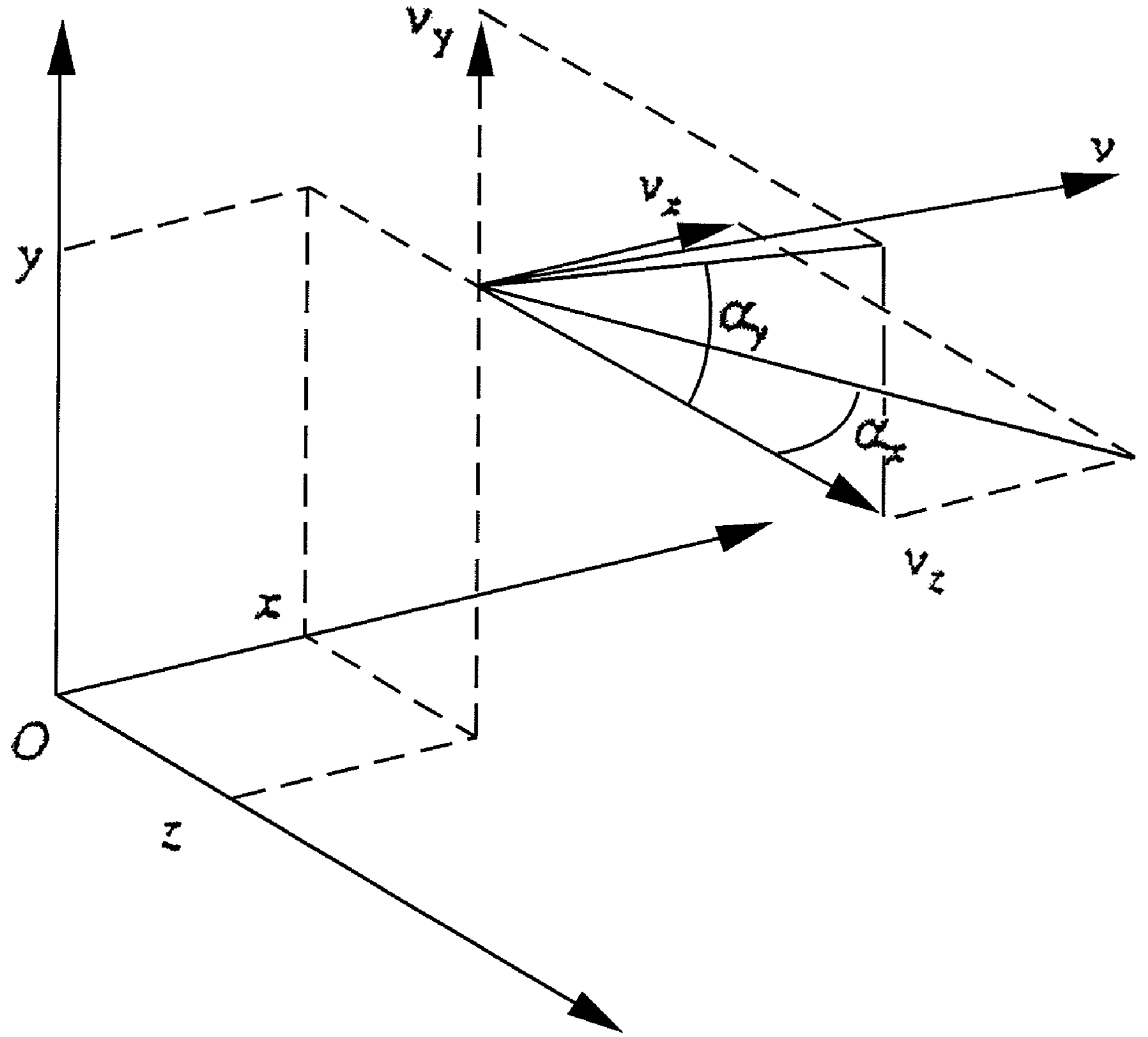
FIG. 9 are coordinate and vector definitions for describing beam emittance.

FIG. 9 shows a coordinate and vector definitions for describing beam emittance. The beam propagation axis coincides with the z axis, x-axis determines the dispersive/horizontal and y-axis the non-dispersive/vertical orientation of the beam. $v_x$, $v_y$ and $v_z$ are the ion velocity components along the x, y and z-axis, respectively. αx and αy are the angles between the beam xz and yz-plane projections and z-axis.

In order to describe the effects of the electrostatic lens on the beam we give a description of beam emittance. Ion beam emittance is the most important parameter describing ion beam quality and ion optical properties. It is defined as the volume that the ion beam particles occupy in the six dimensional phase space (x, $p_x$, y, $p_y$, z, $p_z$), where x, y and z are the space coordinates of the beam particles and $p_x$, $p_y$ and $p_z$ are the corresponding linear momenta of the particles along the space coordinate axis.

Usually the longitudinal emittance projection along the beam axis is of no interest and only the two transverse emittance planes (x, $p_x$) and (y, $p_y$) are considered. In FIG. 9 the velocity vector definitions are shown.

In FIG. 9 $\alpha_x$ and $\alpha_y$ are the divergence angles of the x and y velocity components. Beam direction is chosen to be along z axis.

Let's consider the linear momentum of the ion along x axis. It can be written as $$mv_x = m\frac{dx}{dt} = m\frac{dx}{dz}\frac{dz}{dt} = mx'v_z \propto x' \tag{6}$$

The gradient x' can be written in terms of the divergence angle $\alpha_x$:

$$x' = \frac{dx}{dz} = \frac{v_x}{v_z} = \tan(\alpha_x) \tag{7}$$

Usually $V_x$ is much smaller than $V_z$ and $x' \approx \alpha_x$. In this case the beam emittance is defined as the area that the particles occupy in the (x,x') and (y,y') planes. The emittance pattern is usually an ellipse with half axis A and B. The emittance value is then given by the area of the ellipse $$\epsilon_{x,y} = \pi AB \text{[mm−mrad]} \tag{8}$$

Figure 10:
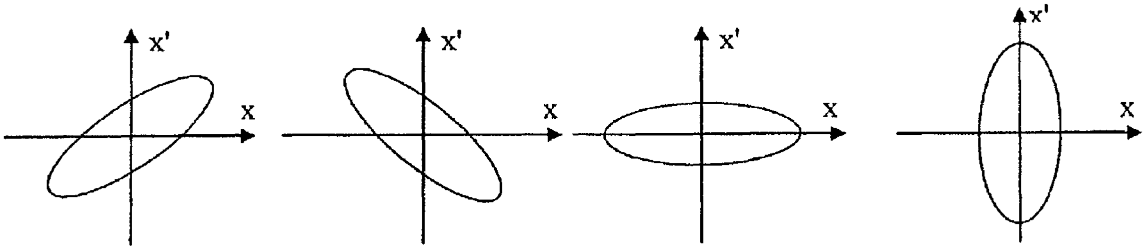
FIG. 10 illustrates emittance ellipse orientations.

The emittance ellipse orientation indicates if the beam is divergent, convergent, parallel or focused. In FIG. 10 the emittance ellipses are shown for each of these cases.

In defining the transverse emittance as the area the beam occupies in (x,x') and (y,y') plane we have neglected the effect of ion beam velocity along the beam axis, $v_z$. If $v_z$ increases, beam divergence and thus the emittance will decrease. This effect is eliminated by using normalized emittance $\epsilon_n$, which is given by:

$$\epsilon_n = \beta\gamma\epsilon \tag{9}$$

where $$\beta = \frac{v_z}{c}$$

is the ratio of the beam axial velocity and the speed of light and $$y = \frac{1}{\sqrt{1-\beta^2}}$$

A widely used emittance definition is the root mean square, or RMS, emittance. It is given by:

$$\varepsilon_{rms} = \sqrt{\overline{x^2 x'^2} - \overline{(xx')}^2} \tag{10}$$

Equation (10) is often multiplied by 4 when measured laboratory emittance values are reported, as this gives an emittance value that corresponds well to the area of ellipse fitted into measured data.

Figure 9A:
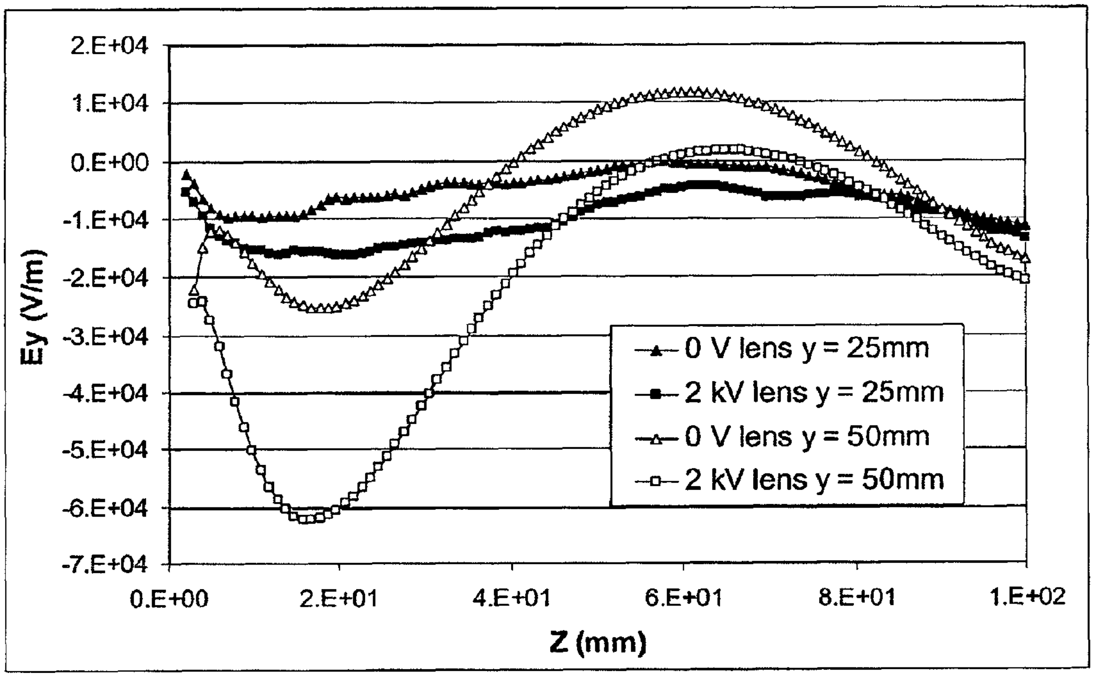
FIG. 9*a* illustrate modeled transverse electric field components $E_y$ at two different y-heights for the geometry shown in FIG. 7.

FIG. 9*a* shows the effect of applied lens element voltage on the vertical electric field component $E_y$, which is the field responsible for focusing and de-focusing of the ion beam in the vertical plane.

The higher the negative $E_y$ value is, the more the beam is focused in the vertical plane. FIG. 9*a* illustrates the very strong focusing effect that can be achieved with the lens elements biased to only +2 kV, even though the beam energy final energy is 80 keV. If an external, separate electrostatic lens would be used for focusing the beam, comparable voltages to the 80 kV source potential would have to be used in order to achieve beam focusing. This is possible due to the fact that in the integrated lens the focusing effect occurs when the beam is passing through the thick extraction aperture plate trench, where the beam energy is still low, regardless what the beam final energy is. By applying a negative bias potential to the lens elements the resulting $E_y$ values will be less negative than with no bias applied. This will result in de-focusing of the beam in vertical plane.

Emittance Ellipse Orientations

Shown in FIG. 10 are 4 cases describing the possible orientations of beam transverse emittance in two dimensional phase space. Case 1 shows a diverging beam emittance ellipse which extends from $3^{rd}$ to the $1^{st}$ quadrant of the xx' coordinate system. Case 2 shows a converging beam occupying mainly the $2^{nd}$ and $4^{th}$ quadrants. Case 3 illustrates a beam that is parallel to the z-axis. Case 4 shows a beam that is at a focal point. In is noteworthy that the beam emittance trace would be a thin line if the ions would have zero temperature. In reality ions will always have a varying amount of thermal energy, which will manifest into the beam emittance as a transverse energy component that causes the emittance pattern to have some lateral dimension, thus resembling an ellipse rather than a thin line.

Figure 11:
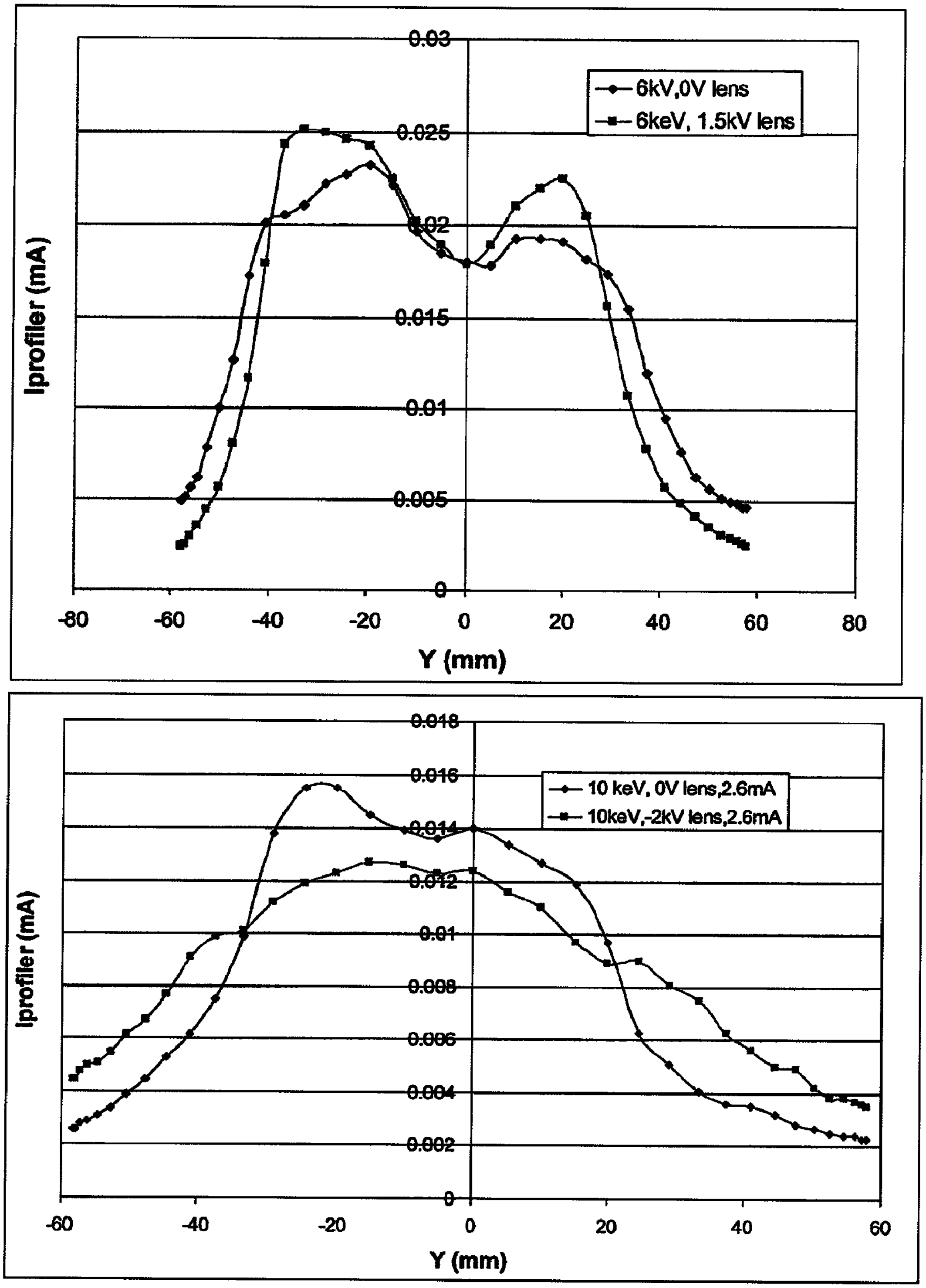
FIG. 11 illustrate measured beam vertical profiles for integrated vertical focusing Cluster Ion Beam Extraction System.

FIG. 11 shows measured vertical $B_{18}$ beam profiles at a distance of 40 cm from the extraction slot with and without the lens bias voltage applied for 6 and 10 keV beam energies using extraction optics shown in FIG. 7. These profiles illustrate the focusing/defocusing effect of the lens.

A positive bias on the lens elements decreases the beam vertical height, whereas a negative bias makes the beam taller. This illustrates how it is possible to tune the beam vertical size using the vertical lens integrated into the Cluster Ion Beam Extraction System.

Figure 12:
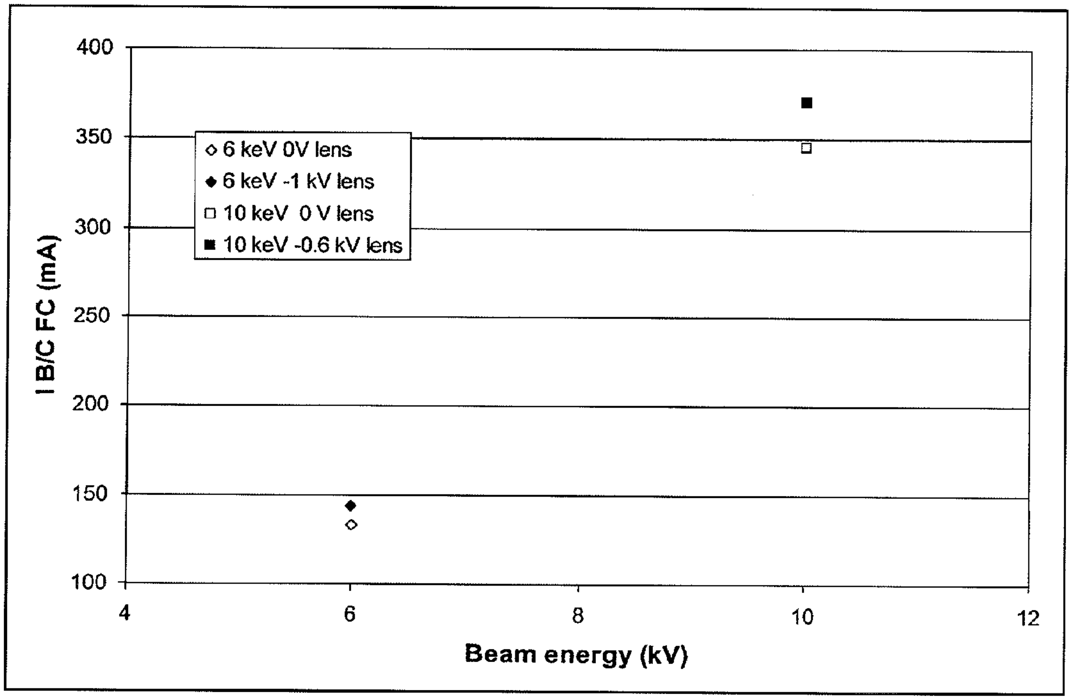
FIG. 12 illustrates the transmitted beam current through an implanter beam line using vertical focusing Cluster Ion Beam Extraction System.

FIG. 12 shows the effect that the lens bias has on transported $B_{18}H_x^+$ beam current through an analyzer magnet and a beam line consisting of quad triplet, beam scanner magnet and a collimator magnet. The lens biasing gives a continuous tuning parameter that can be used to optimize the beam height which benefits the beam transport and results in higher transported beam currents. This will be especially important in cluster ion implanters, which can operate in very broad energy band ranging from 4 keV (0.2 keV boron equivalent) to 80 keV (4 keV boron equivalent) keV beam energy.

The vertical tuning of the beam will also benefit implant operations where the beam current is varied based on the dose requirement of each individual implant. The variation in the beam current on wafer can be as large as 2 orders of magnitude, in which case the space charge effects and thus beam focal lengths will vary significantly. In dispersive plane the extraction gap and suppression voltage can be used to match the beam horizontally. In non-dispersive plane the fixed curvature of the extraction aperture plate and the suppression/ground inserts that are typically used in ion implanter optics will be well matched to only certain energy/beam current range. The integrated electrostatic lens will broaden this range considerably and will allow matching of beam profiles in the non-dispersive plane throughout the energy—and current range of commercial implanter systems.

We claim:

1. An ion extraction system for extracting ions from an ion source, the ion extraction system comprising:

an extraction aperture plate electrode forming one wall of an ionization chamber of an ion source, said extraction aperture plate formed with an aperture through which ions are transported;

a suppression electrode disposed adjacent said extraction aperture plate, said suppression electrode formed with an aperture through which ions are transported, said aperture in said suppression electrode configured to be generally aligned with said aperture in said extraction aperture plate; and a ground electrode disposed adjacent said extraction electrode, said ground electrode formed with an aperture, said aperture in said ground electrode generally aligned with said apertures in said suppression electrode and said extraction aperture plate electrode, wherein said aperture in said extraction aperture plate electrode is configured to minimize over-focus of a cluster ion current.

2. The ion extraction system as recited in claim 1, wherein said aperture in said extraction aperture plate electrode is formed with a flat portion from the upstream edge of the aperture.

3. The ion extraction system as recited in claim 2, wherein said aperture in said extraction aperture plate electrode is formed with a trench portion adjacent the flat portion.

4. The ion extraction system as recited in claim 3, wherein said trench portion is formed with a uniform angle throughout the thickness of the extraction aperture plate.

5. The ion extraction system as recited in claim 3, wherein said trench portion is formed with a non-uniform angle throughout the thickness of the extraction aperture plate.

6. An ion extraction system for extracting ions from an ion source, the ion extraction system comprising:

an extraction aperture plate electrode forming one wall of an ionization chamber of an ion source, said extraction aperture plate formed with an aperture through which ions are transported;

a suppression electrode disposed adjacent said extraction aperture plate, said suppression electrode formed with an aperture through which ions are transported, said aperture in said suppression electrode generally aligned with said aperture in said extraction aperture plate electrode; and a ground electrode disposed adjacent said suppression electrode, said ground electrode formed with an aperture, said aperture in said ground electrode generally aligned with said apertures in said suppression electrode and said extraction aperture plate electrode, wherein said extraction aperture plate electrode formed with an upper portion, a lower portion and a main plate which includes an extraction aperture, said upper portion, said lower portion and said main plate electrically insulated from one another, said upper and lower portions adapted to receive electrical bias voltages for focusing said ion beam.

7. The ion extraction system as recited in claim 6, wherein said bias voltages have the same polarity.

8. The ion extraction system as recited in claim 7, wherein said bias voltages have a positive polarity.

9. The ion extraction system as recited in claim 7, wherein said bias voltages have a negative polarity.

* * * * *